United States Patent
Adar et al.

(10) Patent No.: US 6,759,922 B2
(45) Date of Patent: Jul. 6, 2004

(54) HIGH DIRECTIVITY MULTI-BAND COUPLED-LINE COUPLER FOR RF POWER AMPLIFIER

(75) Inventors: Aharon Adar, Berkeley Heights, NJ (US); Sheldon Xu, Somerville, NJ (US)

(73) Assignee: Anadigics, Inc., Warren, NJ (US)

(*) Notice: Subject to any disclaimer, the term of this patent is extended or adjusted under 35 U.S.C. 154(b) by 0 days.

(21) Appl. No.: 10/147,987

(22) Filed: May 20, 2002

(65) Prior Publication Data

US 2003/0214365 A1 Nov. 20, 2003

(51) Int. Cl.[7] .................................................. H01P 5/18
(52) U.S. Cl. ........................ 333/109; 333/112; 333/116
(58) Field of Search ................................. 333/109, 110, 333/111, 112, 116

(56) References Cited

U.S. PATENT DOCUMENTS

| | | | | |
|---|---|---|---|---|
| 3,593,208 A | * | 7/1971 | Smith | 333/112 |
| 4,150,345 A | * | 4/1979 | Goldman et al. | 333/116 |
| 4,216,446 A | * | 8/1980 | Iwer | 333/112 |
| 4,375,054 A | * | 2/1983 | Pavio | 333/116 |
| 4,376,921 A | * | 3/1983 | Dickens et al. | 333/116 |
| 4,999,593 A | * | 3/1991 | Anderson | 333/112 |
| 5,159,298 A | * | 10/1992 | Dydyk | 333/112 |
| 5,243,305 A | * | 9/1993 | D'Oro et al. | 333/116 |
| 5,281,929 A | * | 1/1994 | Willems | 222/116 |
| 5,424,694 A | * | 6/1995 | Maloratsky et al. | 333/112 |
| 5,576,669 A | * | 11/1996 | Ruelke | 333/116 |
| 5,767,753 A | * | 6/1998 | Ruelke | 333/116 |
| 5,886,589 A | * | 3/1999 | Mourant | 333/26 |
| 6,470,191 B1 | * | 10/2002 | Nielsen et al. | 455/552.1 |
| 6,483,398 B2 | * | 11/2002 | Nagamori et al. | 333/116 |

* cited by examiner

*Primary Examiner*—Robert Pascal
*Assistant Examiner*—Dean Takaoka
(74) *Attorney, Agent, or Firm*—Morgan Lewis Bockius

(57) ABSTRACT

The present invention discloses a miniature high directivity multi-band coupled-line coupler for RF power amplifier module application. The coupler utilizes a three-coupled-line structure, with a first RF line designated coupled line for the GSM 900 MHZ band, a second RF line designated coupled line for the DCS/PCS 1800/1900 MHZ band, and a common coupled line. A first capacitor is connected between the center of the first line and the center of the common line and a second capacitor is connected between the center of the second line and the center of the common line. The coupler has a length considerably less than the length of a quarter wave length coupler while achieving directivity requirements for both GSM band and DCS/PCS band.

7 Claims, 8 Drawing Sheets

US 6,759,922 B2

HIGH DIRECTIVITY MULTI-BAND COUPLED-LINE COUPLER FOR RF POWER AMPLIFIER

FIELD OF THE INVENTION

The present invention generally relates to an RF coupler. More specifically, the present invention relates to a multi-band coupled-line coupler.

BACKGROUND OF THE INVENTION

Couplers are well known in the art. They are used in radio frequency (RF) applications. For example, a coupler can be used in a communication device such as a cellular telephone set.

U.S. Pat. No. 4,216,446 discloses an improvement in directivity and isolation of a quarter wave microstrip directional coupler. The improvement is achieved with the addition of a single capacitor placed across the directive port of the coupler. This patent also discloses a dual coupler scheme but with emphasis on using both coupling lines for single frequency applications.

U.S. Pat. No. 4,376,921 discloses a loosely coupled microstrip coupler with high directivity. A capacitive coupling element is disposed within the coupling region across the main and coupled transmission line sections for supplementing the dielectric capacitive coupling of the gap therebetween to increase the directivity of signal coupling. The reduction of coupler length is realized through adding a series inductor and a parallel resistor to the second coupled line output.

U.S. Pat. No. 5,424,694 discloses a miniature directional coupler. The coupled lines have a length considerably less than one quarter of a wavelength.

U.S. Pat. No. 5,576,669 discloses a coupling device for coupling RF energy. The device includes a first coupling structure and second coupling structure. The addition of the first coupling structure and the second coupling structure allows for a greater coupling efficiency.

The contents of the aforementioned U.S. Pat. Nos. 4,216,446, 4,376,921, 5,424,694, and 5,576,669 are incorporated by reference to the extent necessary to understand the present invention.

SUMMARY OF THE INVENTION

The present invention is directed to a multi-band coupled-line coupler for RF power amplifier module applications. The coupler comprises a first conductor having a first and a second end portion and a first parallel portion therebetween; a second conductor having a first and a second end portion and a second parallel portion therebetween, the second parallel portion positioned substantially parallel to the first parallel portion; a common conductor having a first and a second end portion and a third parallel portion therebetween, the third parallel portion positioned substantially parallel to and between the first and second parallel portion, the third parallel portion having a first distance from the first parallel portion and a second distance from the second parallel portion, the first distance being different from said second distance; a first capacitor connected between a point on the first parallel portion and a point on the third parallel portion; and a second capacitor connected between a point on the second parallel portion and a point on the third parallel portion.

The present invention is also directed to a communication device having a multi-band coupled-line coupler. The coupler comprises a first conductor having a first and a second end portion and a first parallel portion therebetween; a second conductor having a first and a second end portion and a second parallel portion therebetween, the second parallel portion positioned substantially parallel to the first parallel portion; a common conductor having a first and a second end portion and a third parallel portion therebetween, the third parallel portion positioned substantially parallel to and between the first and second parallel portion, the third parallel portion having a first distance from the first parallel portion and a second distance from the second parallel portion, the first distance being different from said second distance; a first capacitor connected between a point on the first parallel portion and a point on the third parallel portion; and a second capacitor connected between a point on the second parallel portion and a point on the third parallel portion.

The communication device may also have a power detector connected to the first end portion of the common conductor; an termination connected to the second end portion of the common conductor; a GSM amplifier connected to the first end portion of the first conductor; a DCS/PCS amplifier connected to the first end portion of the second conductor; a GSM harmonic filter connected to the second end portion of the first conductor; and a DCS/PCS harmonic filter connected to the second end portion of the second conductor. The communication device may also have a switch having at least a first and a second position, the first position connecting the circuits of the first and common conductor, the second position connecting the circuits of the second and common conductor.

BRIEF DESCRIPTION OF THE DRAWINGS

The present invention is described in detail below with reference to the drawings in which.

DETAILED DESCRIPTION OF PREFERRED EMBODIMENTS

Figure 1:
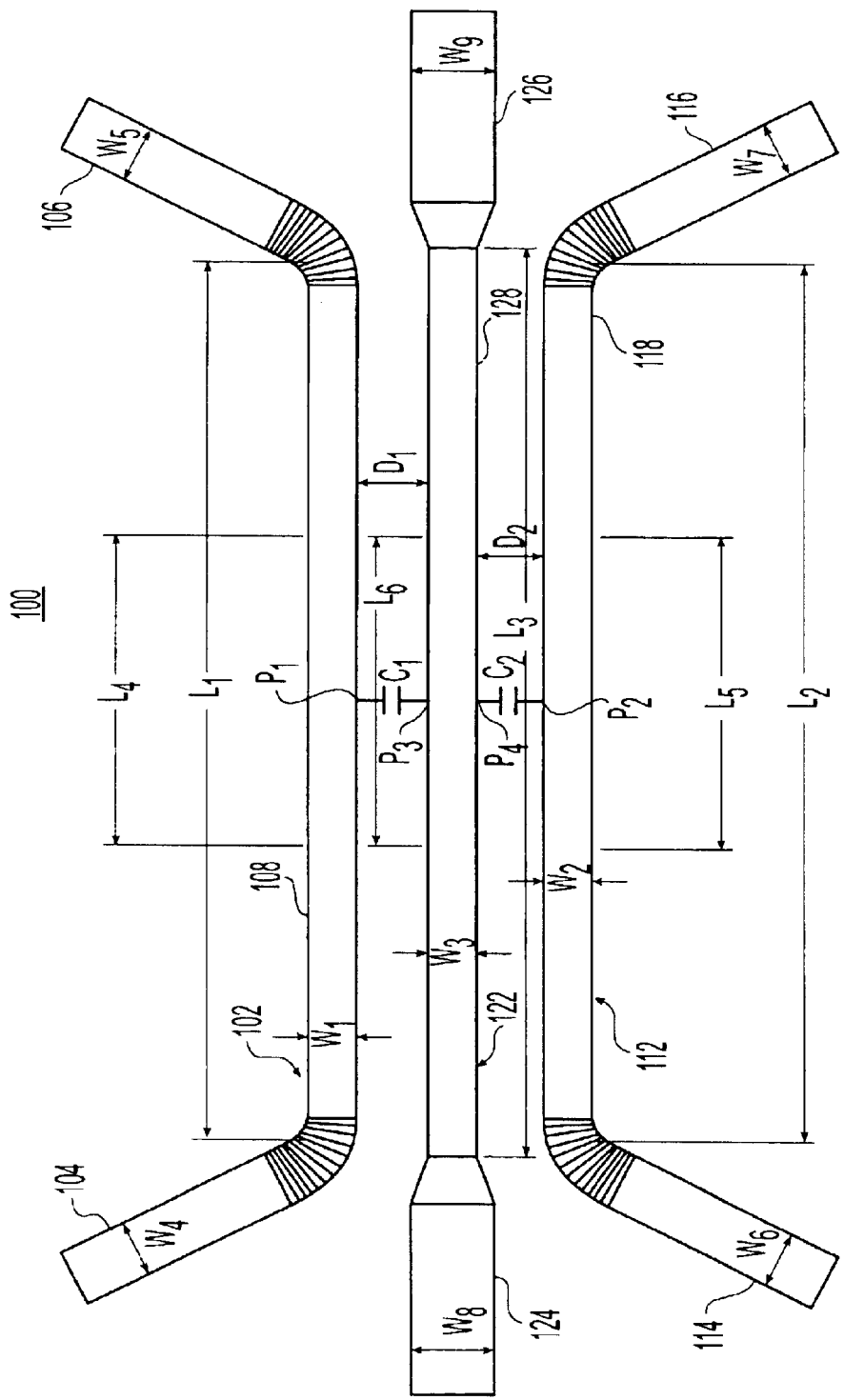
FIG. 1 shows a preferred embodiment of the miniature high directivity multi-band coupled-line coupler for an RF power amplifier module application in accordance with the resent invention.

FIG. 1 shows one embodiment of the miniature high directivity multi-band coupled-line coupler for RF power amplifier module application in accordance with the present invention. As shown in FIG. 1, coupler 100 has a three-coupled-line structure. It contains first conductor 102, second conductor 112, and common conductor 122. First conductor 102, second conductor 112, and common conductor 122 are transmission lines, such as micro strip lines, although one skilled in the art may also use other types of transmission lines. Preferably, the conductors are formed from copper or any other low loss conductor.

Also, the conductors are preferably deposited on a substrate. Placing a coupler on a substrate is well known in the art, as is disclosed in U.S. Pat. No. 4,376,921, whose contents are incorporated by reference to the extent necessary to understand the present invention. In a preferred embodiment of the present invention, the substrate layer is GETEK®, which is available from GE Electromaterials. The thickness of the GETEK® substrate layer is between 8 mil and 10 mil and is preferably 9 mil. The dielectric constant of the GETEK® substrate layer is between 3.8 and 4.0 and is preferably 3.9. The substrate material could be FR4 (Flame Retardant 4), glass, ceramic, or other dielectric material. These materials are familiar to those skilled in the art.

First conductor 102 has a first end portion 104 with a width W4, a second end portion 106 with a width W5, and a first parallel portion 108 between the first end portion 104 and the second end portion 106. First parallel portion 108 has a width W1 and a length L1.

Similarly, second conductor 112 has a first end portion 114 with a width W6, a second end portion 116 with a width W7, and a second parallel portion 118 between the first end portion 114 and the second end portion 116. Second parallel portion 118 has a width W2 and a length L2. Second conductor 112 is placed in such a way that second parallel portion 118 is substantially parallel to first parallel portion 108.

Further, common conductor 122 has a first end portion 124 with a width W8, a second end portion 126 with a width W9, and a third parallel portion 128 between the first end portion 124 and the second end portion 126. Third parallel portion 128 has a width W3 and a length L3. Common conductor 122 is placed between first conductor 102 and second conductor 112 in such a way that third parallel portion 128 is substantially parallel to first parallel portion 108 and second parallel portion 118. A first distance D1 separates the first 108 and third 128 parallel portions, and a second distance D2 separates the second 118 and third 128 parallel portions, with D1 being different from D2.

The first capacitor C1 and second capacitor C2 may either be lumped or distributed capacitors. First capacitor C1 is connected between a point P1 on first parallel portion 108 and a point P3 on third parallel portion 128. Second capacitor C2 is connected between a point P2 on second parallel portion 118 and a point P4 on third parallel portion 128. P3 and P4 preferably are co-located on third parallel portion 128. In a preferred embodiment, the lengths of first parallel portion 108, second parallel portion 118, and third parallel portion 128 are substantially the same.

Preferably, P1 resides within a central section L4 of parallel portion 108. In the context of this disclosure, a central section is considered to comprise the central one third of a parallel portion. Similarly, P2 preferably resides within a central section L5 of parallel portion 118 and P3 and P4 preferably reside within a central section L6 of parallel portion 128. Still preferably, P1 is the center point of parallel portion 108, P2 is the center point of parallel portion 118, and P3 and P4 are the center point of parallel portion 128.

Coupler 100 can be used in any general RF/microwave system. Coupler 100 is preferably used in communication devices, including wired and wireless communication devices. Preferably, coupler 100 is used in handheld communication devices, such as cellular telephone sets. Also, coupler 100 is preferably used in multi-band applications, such as GSM (Global System for Mobile Communications), DCS (Digital Cellular System), or PCS (Personal Communications Services) dual or tri band applications.

Figure 2A:
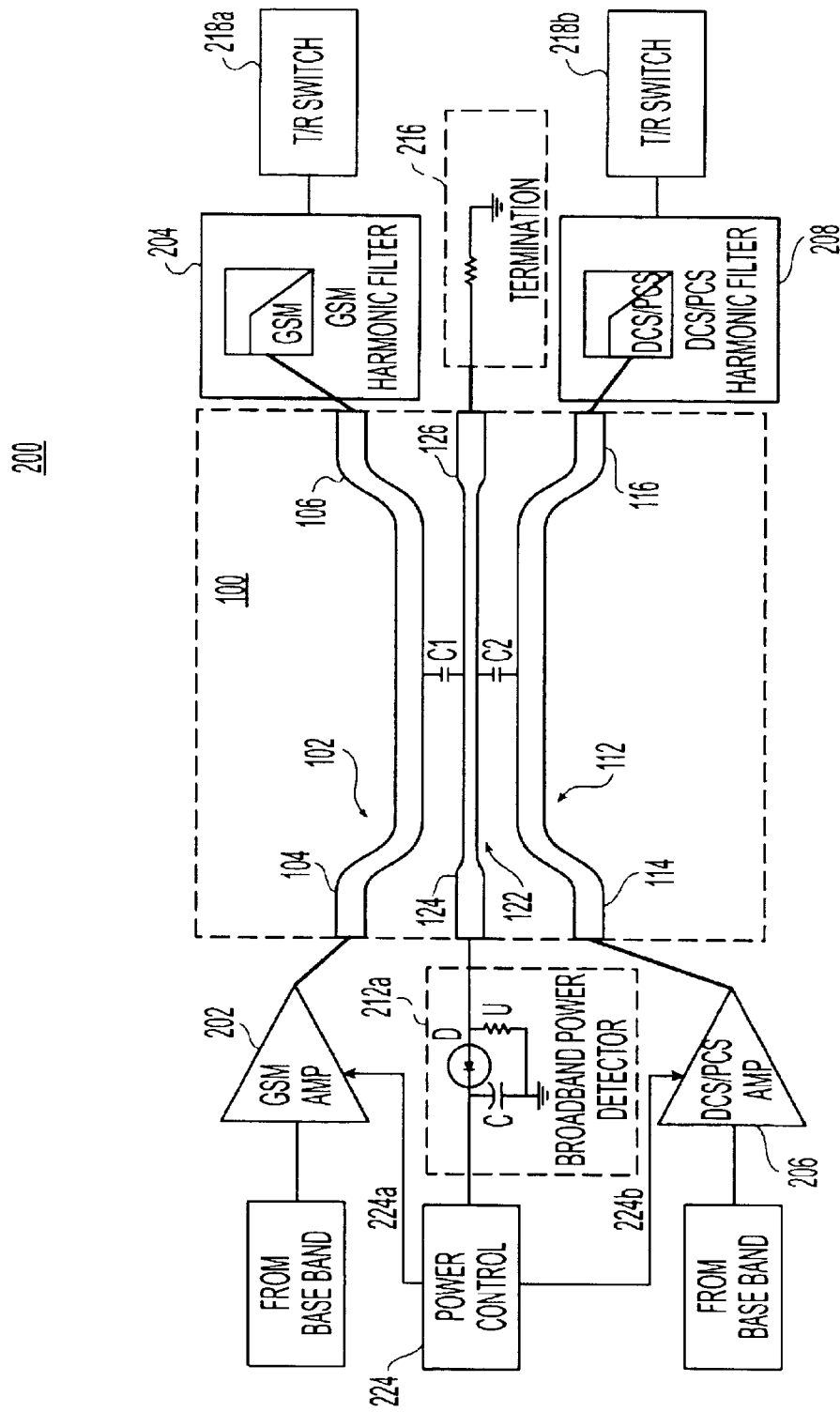
FIG. 2a shows a preferred arrangement of the coupler of FIG. 1 in a GSM and DCS/PCS multi-band application of a communication device.

FIG. 2a shows a preferred arrangement of coupler 100 in a GSM and DCS/PCS multi-band system 200 of a communication device. As shown in FIG. 2a, first conductor 102 receives GSM RF signals at first end portion 104 through GSM amplifier 202 and sends the signals to a first Transmit/Receive (T/R) switch 218a at second end portion 106 through GSM harmonic filter 204. Similarly, second conductor 112 receives DCS/PCS RF signals at first end portion 114 through DCS/PCS amplifier 206 and sends the signals to a second T/R switch 218b at second end portion 116 through DCS/PCS harmonic filter 208.

In addition, common conductor 122 is connected at first end portion 124 to power detector 212a, which preferably is broadband and so can accommodate both GSM and DCS/PCS. The power detector 212a is connected via a power control circuit 224 which sends control, gain and/or bias signals 224a, 224b to GSM amplifier 202 and DCS/PCS amplifier 206, respectively. The power control circuit 224 may include a controller, or the like, and is configured to receive at least one signal from the power detector and, in response, outputs control, gain and/or bias signals 224a, 224b.

The second end portion 126 of common conductor 122 is connected to termination 216. Preferably, termination 216 terminates second end portion 126 into 50 Ohm resistors, although other resistance termination may also be used. The power detector 212a may comprise a diode D, a capacitor C, and a resistor R, although other power detector types may be used.

In a preferred embodiment, the first T/R switch 218a and the second T/R switch 218b are different switches. In another preferred embodiment, the first T/R switch 218a and the second T/R switch 218b can be a single multi-pole, multi-throw switch, in which case the position of this switch is based on which wireless network service the communication device is using. The switches used in the communication device can be either solid state switches or electromechanical switches, or even combinations of the two types.

As shown in FIGS. 1 and 2a, common conductor 122 is the center line of a three-coupled-line structure and serves as the coupled line of a three-coupled-line coupler. This configuration is suitable for multi-band applications and is readily applicable to existing multi-band applications. In operation, depending on the type of wireless network service available, either the GSM or the DCS/PCS amplifier is invoked.

In GSM mode, GSM amplifier 202 and GSM side T/R switch 218a are invoked while DCS/PCS amplifier 206 and DCS/PCS side T/R switch 218b remain off. Base band signal is amplified by GSM power amplifier 202. The RF signal travels through first conductor 102. At the parallel portion 108 of first conductor 102, a small portion of RF signal is coupled to the parallel portion 128 of common conductor 122. The purpose of adding capacitor C1 is to increase the coupling between the first conductor 102 and common conductor 122 and, at the same time, to maintain good isolation of common conductor 122 at isolated port 126. Therefore the length of the coupled line can be significantly reduced. The power detector 212a at the coupled port 124 detects this coupled RF power, converts the power level to a DC value, and feeds it to power control circuit 224. Power control circuit 224 can thus control the output power of GSM power amplifier 202.

Similarly, in DCS or PCS mode, DCS/PCS amplifier 206 and T/R switch 218b are invoked while GSM amplifier 202 and T/R switch 218a remain off. The RF signal travels through second conductor 112. At the parallel portion 118 of second conductor 112, a small portion of RF signal is coupled to the parallel portion 128 of common conductor 122. The purpose of adding capacitor C2 is to increase the coupling between the second conductor 112 and common conductor 122 and, at the same time, to maintain good isolation of common conductor 122 at isolated port 126. Therefore the length of the coupled line can be significantly reduced. The power detector 212a at the coupled port 124 detects this coupled RF power, converts the power level to a DC value, and feeds it to power control circuit 224. Thus, power control circuit 224 can again control the output power of DCS/PCS power amplifier 206.

In the preferred arrangement shown in FIG. 2a, there is no need for a band switch when the power detector 212a has sufficient bandwidth to cover both the GSM and the DCS/PCS bands. However, when the power detector 212a does not have sufficient bandwidth or only a particular band is desired, a band switch may be used to switch between the GSM and the DCS/PCS bands. For example, if only the GSM 900 MHZ band is needed in a certain case, a band switch can be used to confine the frequency between 850 and 950 MHZ.

Figure 2B:
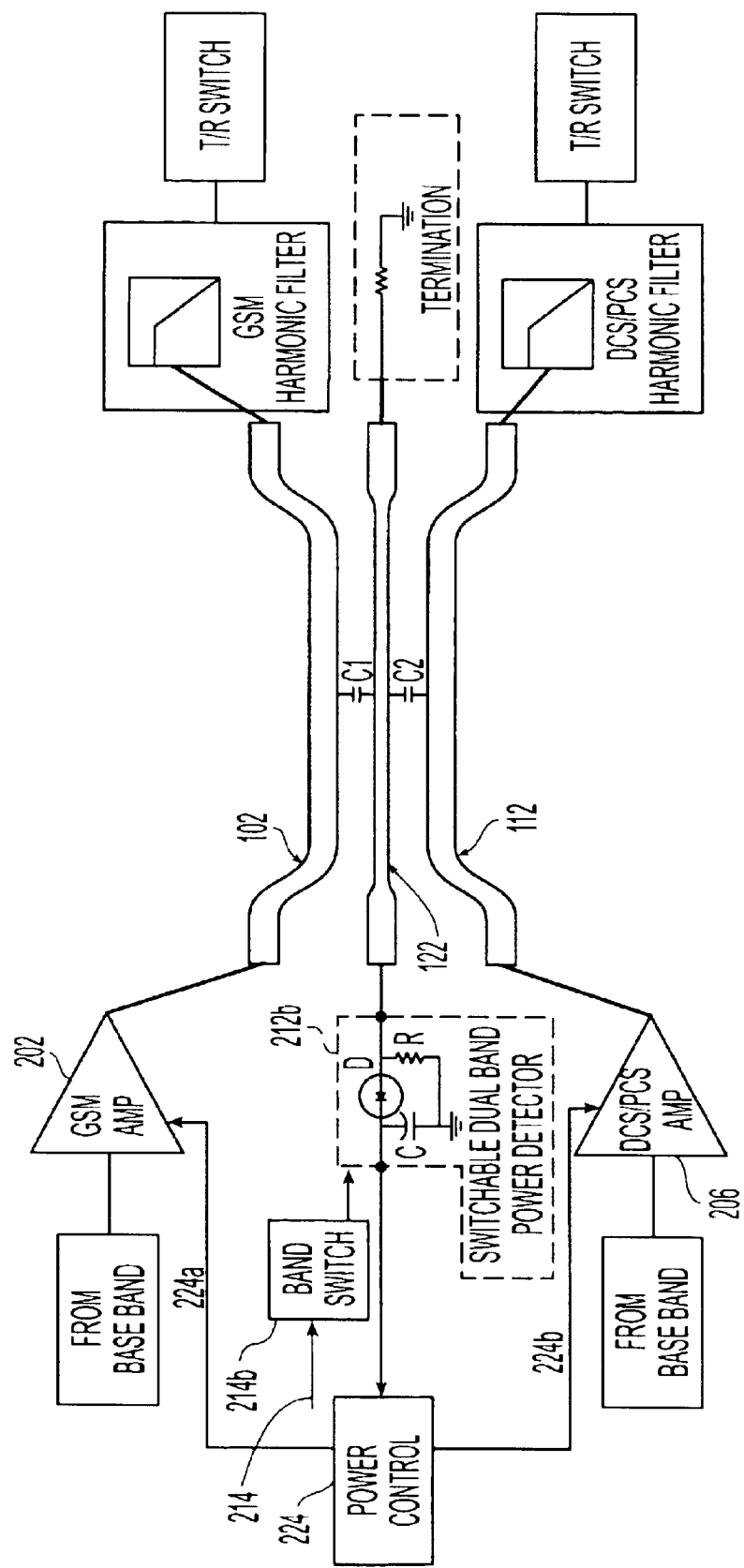
FIG. 2b shows an alternative preferred arrangement of the coupler of FIG. 1 in a GSM and DCS/PCS multi-band application of a communication device.

FIG. 2b shows an alternative preferred arrangement of the coupler of FIG. 1 in a GSM and DCS/PCS multi-band application of a communication device. The arrangement shown in FIG. 2b is substantially the same as that shown in FIG. 2a, except there is a band switch 214b connected to the power detector 212b. The band switch, which is responsive to one or more mode control signals 214, preferably has three positions. When it is at the first position, the band switch 214b links the common conductor 122 to the first conductor 102, thereby establishing a coupler for the GSM band. When it is at the second position, the band switch 214b links the common conductor 122 to the second conductor 112, therefore establishing a coupler for the DCS/PCS band. The third position is a neutral or "off" position, where the common conductor 122 is linked to neither the first conductor 102, nor the second conductor 112. Regardless of which position the band switch 214b may occupy, the output of the power detector 212b is presented to the power control circuit 224 which provides control, gain and/or bias signals 224a, 224b to the GSM amplifier 202 and the DCS/PCS amplifier 206, respectively.

It should be noted that the band switch 214b may be either an electronic switch, in which case it has no moving parts, or a mechanical switch, or a combination of the two. It should also be noted that the band switch 214b may only occupy one of two positions, with the first establishing a coupler for the GSM band and the second establishing a coupler for the DCS/PCS band. The band switch 214b preferably also adjusts the values of components belonging to power detector 212b. Although not explicitly shown in FIG. 2b, the band switch 214b may vary the resistance of the resistor R and/or the capacitance of the capacitor C of the power detector 212b to values suitable for the selected band. When power detectors having other configurations are employed, such a band switch would typically adjust one or more parameters or elements, as appropriate to the band being used—GSM band, DCS/PCS band, or other band, if present.

Figure 2C:
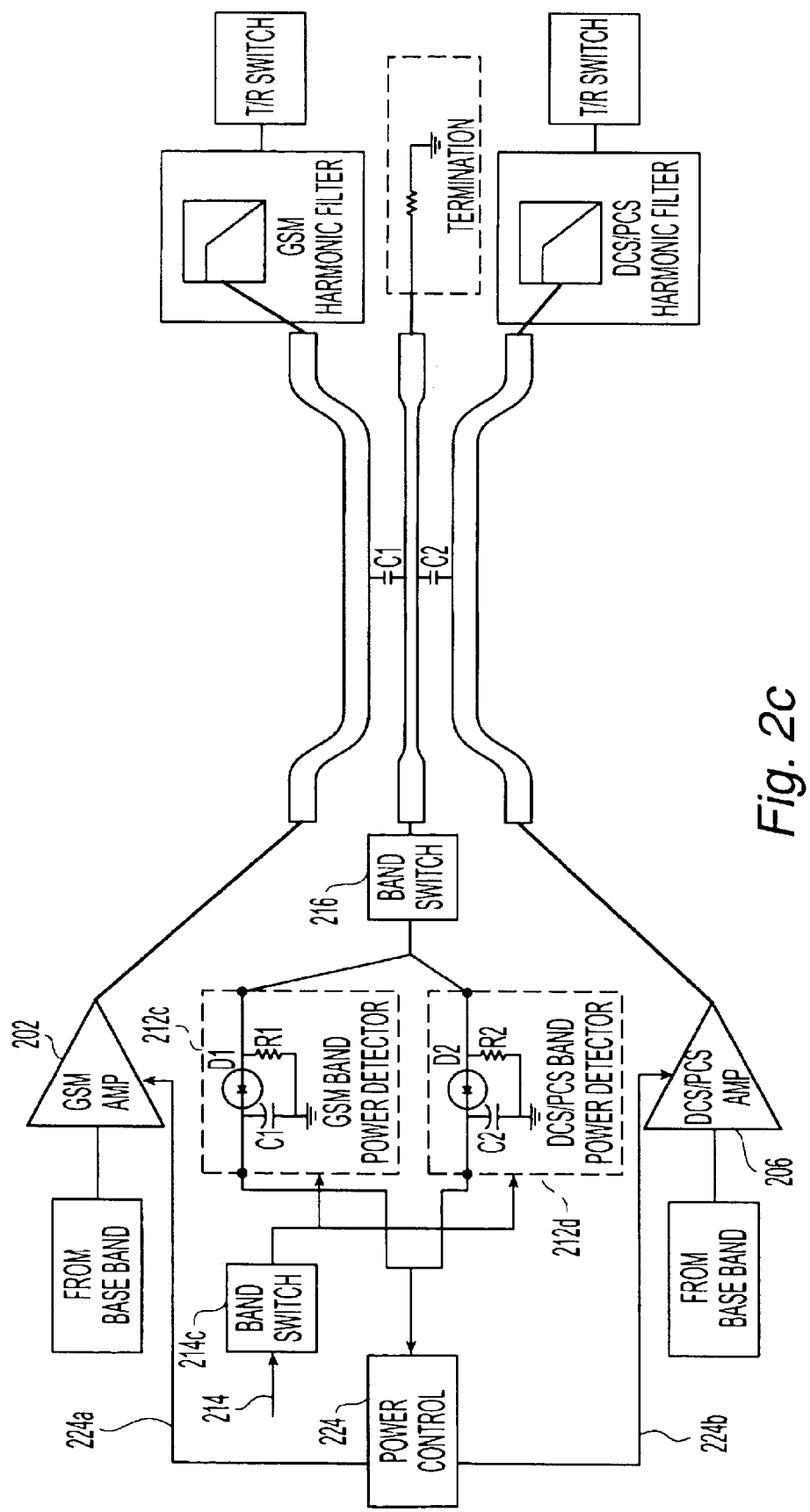
FIG. 2c shows another alternative preferred arrangement of the coupler of FIG. 1 in a GSM and DCS/PCS multi-band application of a communication device.

Alternatively, as shown in the arrangement in FIG. 2c, a band switch 214c, which is responsive to one or more mode control signals 214, is associated with a pair of power detectors 212c, 212d which are connected to the common conductor 122. The power detectors are also connected to a power control circuit 224 which sends control, gain and/or bias signals 224a, 224b to the amplifiers 202, 206, respectively. The first power detector 212c is for the GSM band preferably comprises a diode D1, a resistor with a resistance R1, and a capacitor with a capacitance C1, with R1 and C1 conforming to the requirements for the GSM band. Similarly, the second power detector 212d is for the DCS/PCS band and preferably comprises a diode D2, a resistor with a resistance R2, and a capacitor with a capacitance C2, with R2 and C2 conforming to the requirements for the DCS/PCS band. The band switch 214c switches between the first power detector 212c and the second power detector 212d, establishing a coupler for the GSM band and the DCS/PCS band, respectively, as appropriate.

The various parameters in the coupler 100 of FIG. 1 may take different values to accommodate different frequencies. In a preferred embodiment to accommodate GSM and DCS/PCS frequencies, the parameters take the values that are summarized in Table 1.

TABLE 1

Parameters of one preferred embodiment of coupler 100.

|     | Preferred range | Exemplary value |
| --- | --- | --- |
| L1  | 270–330 mil | 300 mil |
| L2  | 270–330 mil | 300 mil |
| L3  | 270–330 mil | 300 mil |
| W1  | 16–20 mil | 18 mil |
| W2  | 16–20 mil | 18 mil |
| W3  | 7–9 mil | 8 mil |
| W4  | 16–20 mil | 18 mil |
| W5  | 16–20 mil | 18 mil |
| W6  | 16–20 mil | 18 mil |
| W7  | 16–20 mil | 18 mil |
| W8  | 16–20 mil | 18 mil |
| W9  | 16–20 mil | 18 mil |
| D1  | 4.5–5.5 mil | 5 mil |
| D2  | 10–14 mil | 12 mil |
| C1  | 0.18–0.22 pF | 0.20 pF |
| C2  | 0.11–0.15 pF | 0.13 pF |

FIG. 3 shows simulated results demonstrating the improved performance of coupler 100 with parameters listed in Table 1. FIG. 3a shows the coupling performance of the miniature multi-band coupler 100. The top curve 302 is the coupling from the first end portion 104 of the first conductor 102 to the first end portion 124 of the common conductor 122. The first end portion 104 of the first conductor 102 serves as the GSM amplifier port and the first end portion 124 of the common conductor 122 serves as the coupling port. Similarly, the bottom curve 304 is the coupling from the first end portion 114 of the second conductor 112 to the first end portion 124 of the common conductor 122. The first end portion 114 of the second conductor 112 serves as the DCS/PCS amplifier port and the first end portion 124 of the common conductor 122 serves as the coupling port. As shown in FIG. 3a, Marker 1 "m1" shows a −21.42 dB coupling at 900 MHZ band and Marker 2 "m2" shows a −20.52 dB coupling at 1900 MHZ band.

Figure 3A:
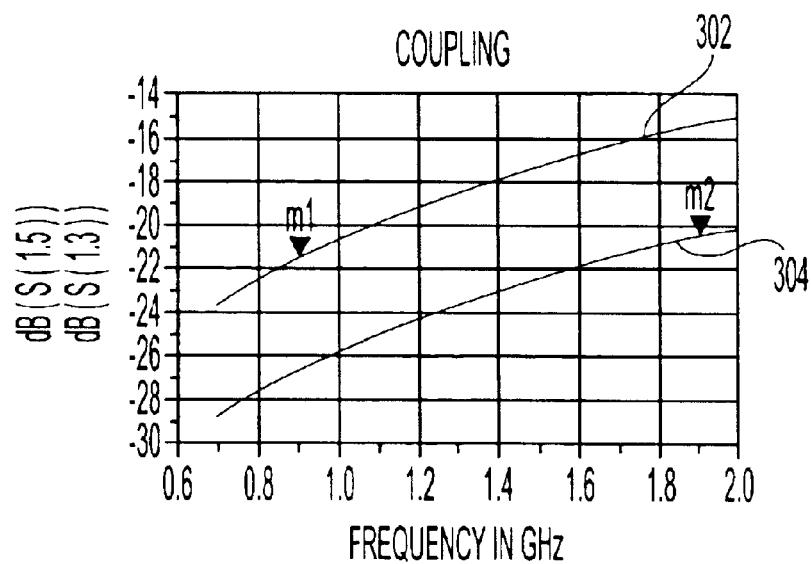
FIGS. 3a–e show simulated results demonstrating the improved performance of the coupler of FIG. 1.
Figure 3B:
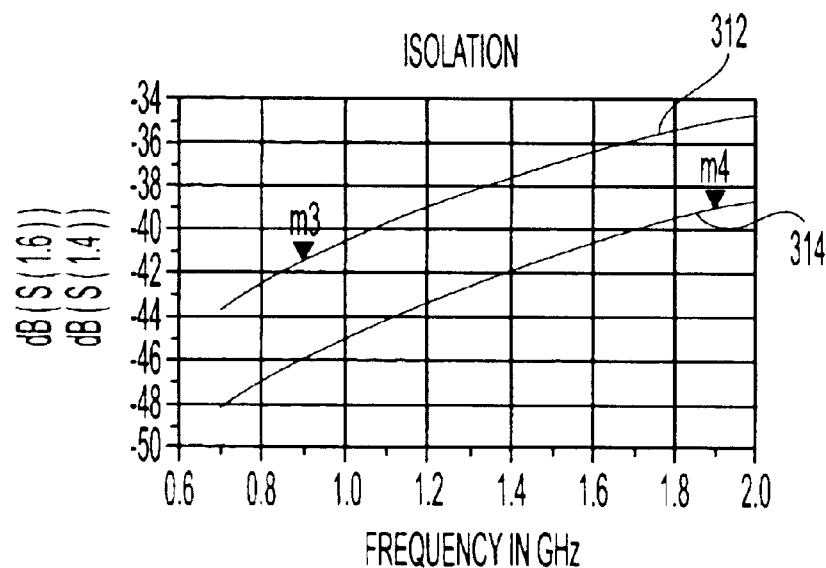

FIG. 3b is the isolation performance of the coupler 100. The top curve 312 is the isolation from the first end portion 104 of the first conductor 102 to the second end portion 126 of the common conductor 122. The first end portion 104 of the first conductor 102 serves as the GSM amplifier port and the second end portion 126 of the common conductor 122 serves as the isolation port. Similarly, the bottom curve 314 is the isolation from the first end portion 114 of the second conductor 112 to the second end portion 126 of the common conductor 122. The first end portion 114 of the second conductor 112 serves as the DCS/PCS amplifier port and the second end portion 126 of the common conductor 122 serves as the isolation port. As shown in FIG. 3b, Marker 3 "m3" shows −41.55 dB isolation at 900 MHZ band and Marker 4 "m4" shows −39.18 isolation at 1900 MHZ band.

Figure 3C:
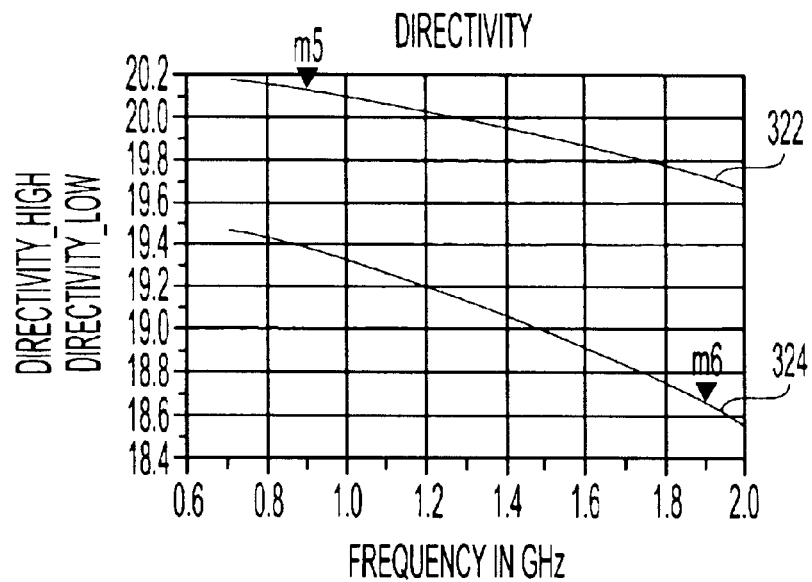

FIG. 3c is the directivity of the coupler 100. The top curve 322 is the directivity for the GSM 900 MHZ band. The bottom curve 324 is the directivity for the DCS/PCS band. As shown in FIG. 3c, Marker 5 "m5" shows 20.13 dB directivity at 900 MHZ band and Marker 6 "m6" shows 18.66 dB directivity at 1900 MHZ band.

Figure 3D:
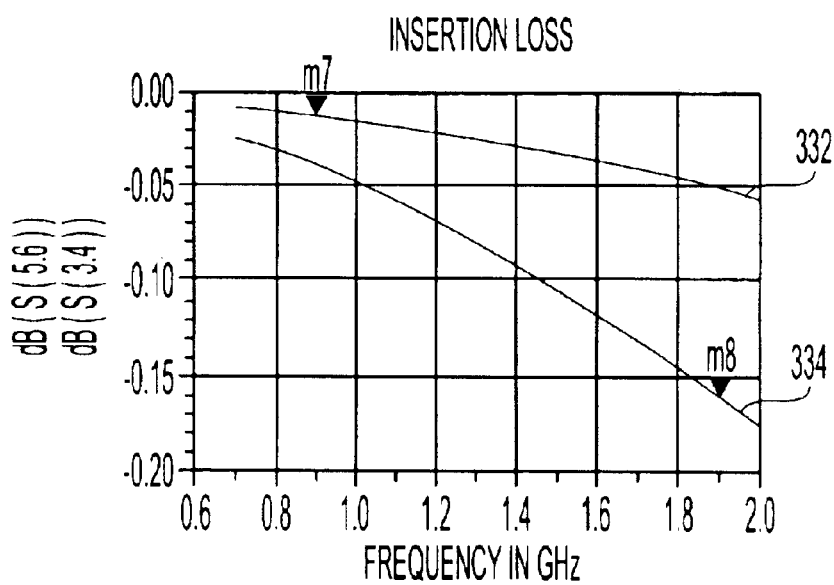

FIG. 3d is the insertion loss performance of the coupler 100. The top curve 332 is insertion loss for the GSM band. The bottom curve 334 is the insertion loss for the DCS/PCS band. As shown in FIG. 3d, Marker 7 "m7" shows 0.04 dB insertion loss at 900 MHZ band and Marker 8 "m8" shows 0.05 dB insertion loss at 1900 MHZ band.

Figure 3E:
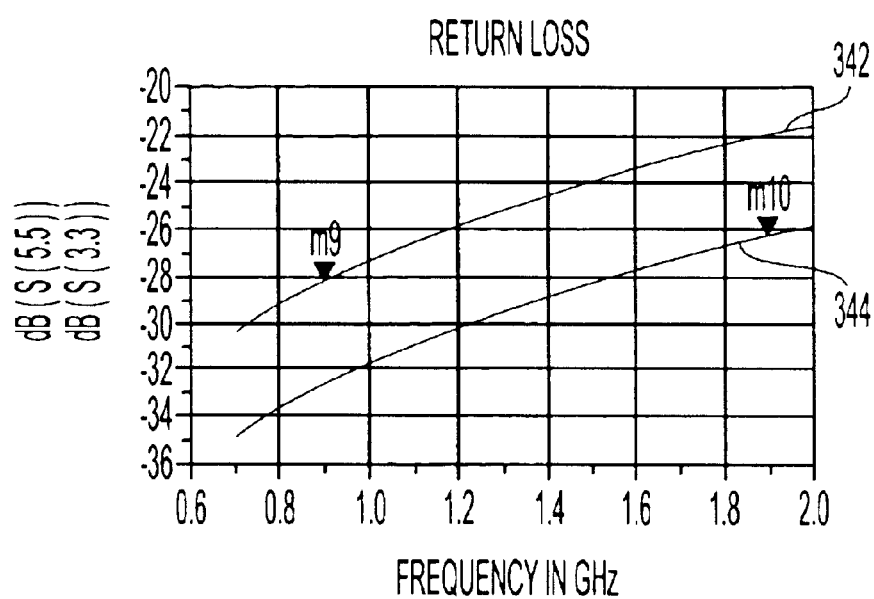

FIG. 3e is the return loss performance of the coupler 100. The top curve 342 is the return loss for the GSM band. The bottom curve 344 is the return loss for the DCS/PCS band. Marker 9 "m9" shows −28.18 dB return loss at 900 MHZ band and Marker 10 "m10" shows −26.29 dB return loss at 1900 MHZ band.

Figure 4:
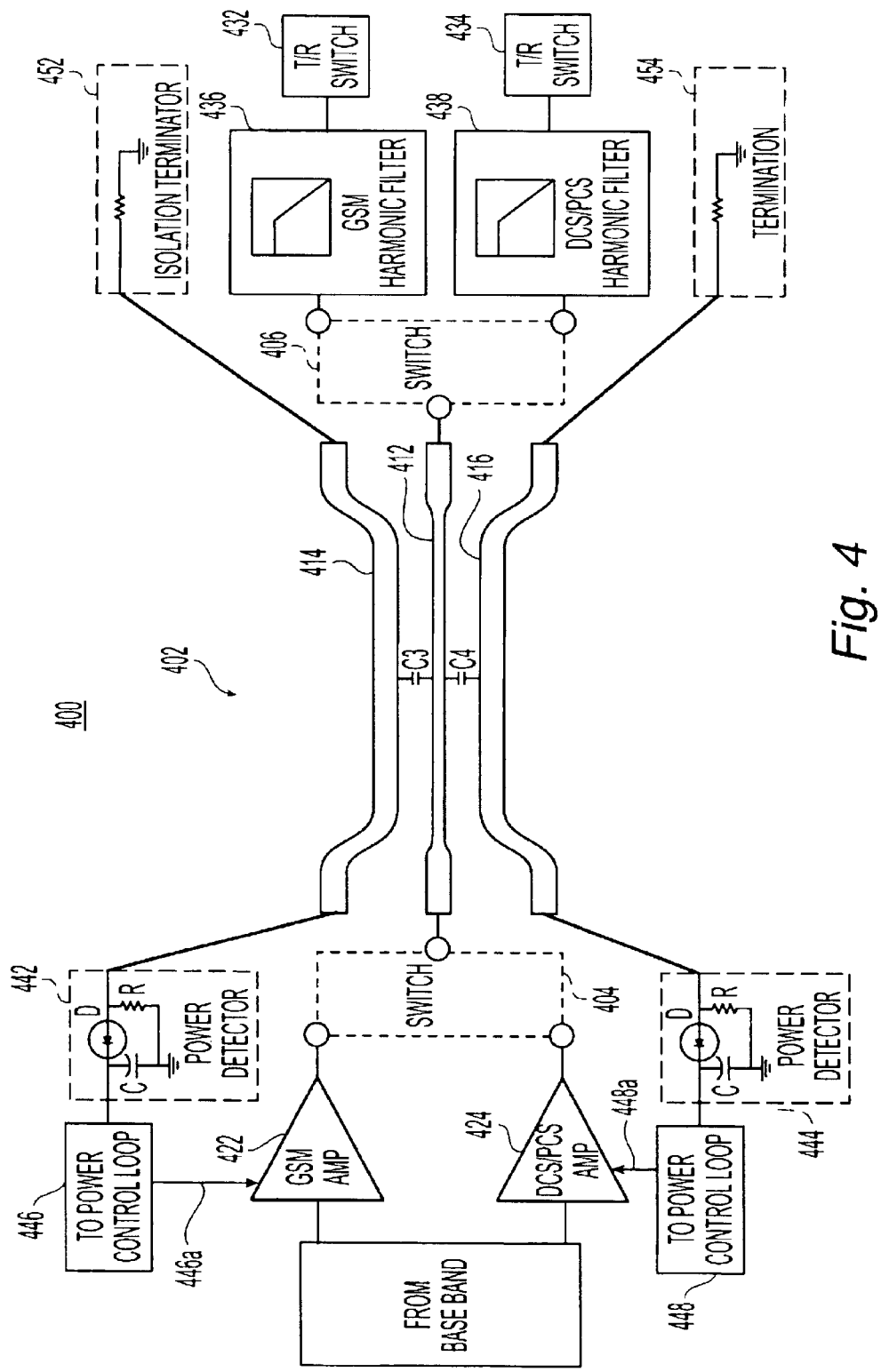
FIG. 4 shows an alternative embodiment of the miniature high directivity multi-band coupled-line coupler for an RF power amplifier module application in accordance with the present invention.

In an alternative embodiment of the present invention, the center conductor may be used as the RF line and the two conductors on each side of the center conductor are used as coupled lines. FIG. 4 shows a system 400 provided with a coupler 402 in which both GSM and DCS/PCS share the same center conductor as the RF line. A single switch, either electronic or mechanical, can be used to switch the center conductor to either the GSM power amplifier or the DCS/PCS power amplifier.

Thus, as shown in FIG. 4, the coupler 402 has a three-coupled-line structure, in a configuration similar to that shown in FIG. 1. Here, however, the RF line 412 is the center line and the first coupled line 414 and the second coupled line 416 are on each side of the RF line 412. The first coupled line 414 is for the GSM band and the second coupled line 416 is for the DCS/PCS band. A GSM-suitable capacitor C3 is connected between the central portions of the RF line 412 and the first coupled line 414. Similarly, a DCS/PCS-suitable capacitor C4 is connected between the central portions of the RF line 412 and the second coupled line 416.

As further shown in FIG. 4, the RF line 412 receives GSM or DCS/PCS signals through a GSM amplifier 422 or a DCS/PCS amplifier 424 and sends the signals to a GSM Transmit/Receive (T/R) switch 432, or a DCS/PCS Transmit/Receive (T/R) switch 434, through a GSM harmonic filter 436 or a DCS/PCS harmonic filter 438, respectively. A first switch 404 switches between the GSM amplifier 422 and the DCS/PCS amplifier 424, depending on the signal type being received. A second switch 406 switches between the GSM harmonic filter 436 and the DCS/PCS harmonic filter 438, depending on the signal type being sent.

In addition, the first coupled line 414 is connected, at one end, to a GSM power control circuit 446 through a GSM power detector 442. At the other end, it is connected to a GSM termination 452. Similarly, the second coupled line 416 is connected, at one end, to a DCS/PCS power control circuit 448 through a DCS/PCS power detector 444. At the other end, it is connected to a DCS/PCS termination 454. As shown in FIG. 4, the first switch 404, the GSM power detector 442, and the DCS/PCS power detector 444 reside at the same end of the three-line structure of the coupler 402, while the second switch 406, the GSM termination 452, and the DCS/PCS termination 454 reside at the other end.

In operation, depending on the type of wireless network service available, either the GSM or the DCS/PCS amplifier is invoked. In GSM mode, the first switch 404 is switched to the GSM amplifier 422 and the second switch 406 is switched to the GSM harmonic filter 436. Thus, the GSM amplifier 422 and the GSM T/R switch 432 are invoked while the DCS/PCS amplifier 424 and the DCS/PCS T/R switch 434 remain off. The base band signal is amplified by the GSM power amplifier 422 controlled by a control, gain and/or bias signal 446a from power control circuit 446. The RF signal travels through the RF line 412. At the parallel portion of the RF line 412, a small portion of the RF signal is coupled to the parallel portion of the first coupled line 414. The GSM capacitor-suitable C3 increases the coupling between the RF line 412 and the first coupled line 414 and, at the same time, maintains good isolation of the first coupled line 414. The GSM power detector 442 detects this coupled RF power, converts the power level to a DC value, and feeds it to the GSM power control circuit 446. The GSM power control circuit 446 can thus control the output power of the GSM power amplifier 422.

Similarly, in DCS/PCS mode, the first switch 404 is switched to the DCS/PCS amplifier 424 and the second switch 406 is switched to the DCS/PCS harmonic filter 438. Thus, the DCS/PCS amplifier 424 and the DCS/PCS T/R switch 434 are invoked while the GSM amplifier 422 and the GSM T/R switch 432 remain off. The base band signal is amplified by the DCS/PCS power amplifier 424 controlled by a control, gain and/or bias signal 448a from power control circuit 448. The RF signal travels through the RF line 412. At the parallel portion of the RF line 412, a small portion of the RF signal is coupled to the parallel portion of the second coupled line 416. The DCS/PCS-suitable capacitor C4 increases the coupling between the RF line 412 and the second coupled line 416 and, at the same time, maintains good isolation of the second coupled line 416. The DCS/PCS power detector 444 detects this coupled RF power, converts the power level to a DC value, and feeds it to the DCS/PCS power control circuit 448. The DCS/PCS power control circuit 448 can thus control the output power of the DCS/PCS power amplifier 424.

In the foregoing discussion of FIG. 4, switches 404, 406 were both activated. It may be possible, however, to eliminate one of the two switches 404, 406 to thereby reduce losses associated with using both switches. In such case, either both amplifiers 422, 424 would feed the RF line 412, or the RF line would feed both filters 436, 438, with any additional signal selection being done elsewhere in the overall device in which the coupler is used.

The present invention can result in a miniature multi-band coupler with good directivity performance. By optimizing the individual geometry of each line of a dual coupler, such as width, length, and space and the capacitances of the capacitors connecting the center coupling line to the RF lines, the present invention discloses a coupler which is only 300 mil in total length yet can achieve a 20 dB coupling, which is better than the 18 dB directivity for GSM 900 MHZ band, DCS 1800 MHZ band, and PCS 1900 MHz band. With such advantageous features, the disclosed coupler is well suited for applications such as dual band or triband power amplifier modules.

While the invention has been described and illustrated herein with respect to preferred embodiments, it should be apparent that various alternatives, modifications, adaptions, and variations will be apparent to those skilled in the art and may be made utilizing the teachings of the present disclosure without departing from the scope of the invention and are intended to be within the scope of the invention as defined by the claims herein.

What is claimed is:

1. A multi-band coupled-line coupler for RF power amplifier module application comprising:
   a first conductor having a first and a second end portion and a first parallel portion therebetween;
   a second conductor having a first and a second end portion and a second parallel portion therebetween, said second parallel portion positioned substantially parallel to said first parallel portion;
   a common conductor having a first and a second end portion and a third parallel portion therebetween, said third parallel portion positioned substantially parallel to and between said first and second parallel portion, said third parallel portion having a first distance from said first parallel portion and a second distance from said second parallel portion, said first distance being different from said second distance;
   a first capacitor connected between a first point on said first parallel portion and a third point on said third parallel portion; and
   a second capacitor connected between a second point on said second parallel portion and a fourth point on said third parallel portion, wherein lengths of said first, second, and third parallel portion are substantially the same, and wherein:
      said first parallel portion has a length between 270 mil and 330 mil;
      said first distance is between 4.5 mil and 5.5 mil;
      said second distance is between 10 mil and 14 mil;
      said first capacitor has a capacitance between 0.18 pF and 0.22 pF;
      said second capacitor has a capacitance between 0.11 pF and 0.15 pF;
      said third parallel portion has a width between 7 mil and 9 mil;
      said first parallel portion has a width between 16 mil and 20 mil;
      said second parallel portion has a width between 16 mil and 20 mil;
      said first end portion of said first conductor has a width between 16 mil and 20 mil;
      said second end portion of said first conductor has a width between 16 mil and 20 mil;
      said first end portion of said second conductor has a width between 16 mil and 20 mil;
      said second end portion of said second conductor has a width between 16 mil and 20 mil;
      said first end portion of said common conductor has a width between 16 mil and 20 mil; and
      said second end portion of said common conductor has a width between 16 mil and 20 mil.

2. A multi-band coupled-line coupler for RF power amplifier module application comprising:
   a first conductor having a first and a second end portion and a first parallel portion therebetween;
   a second conductor having a first and a second end portion and a second parallel portion therebetween, said second parallel portion positioned substantially parallel to said first parallel portion;
   a common conductor having a first and a second end portion and a third parallel portion therebetween, said third parallel portion positioned substantially parallel to and between said first and second parallel portion, said third parallel portion having a first distance from said first parallel portion and a second distance from said second parallel portion, said first distance being different from said second distance;
   a first capacitor connected between a first point on said first parallel portion and a third point on said third parallel portion; and
   a second capacitor connected between a second point on said second parallel portion and a fourth point on said third parallel portion, wherein lengths of said first, second, and third parallel portion are substantially the same, and wherein:
      said first parallel portion has a length between 300 mil and 340 mil;
      said first distance is between 7.5 mil and 8.5 mil;
      said second distance is between 16 mil and 20 mil;
      said first capacitor has a capacitance between 0.22 pF and 0.26 pF;
      said second capacitor has a capacitance between 0.10 pF and 0.14 pF;
      said third parallel portion has a width between 10 mil and 14 mil;
      said first parallel portion has a width between 10 mil and 14 mil;
      said second parallel portion has a width between 12 mil and 16 mil;
      said first end portion of said first conductor has a width between 20 mil and 24 mil;
      said second end portion of said first conductor has a width between 20 mil and 24 mil;
      said first end portion of said second conductor has a width between 20 mil and 24 mil;
      said second end portion of said second conductor has a width between 20 mil and 24 mil;
      said first end portion of said common conductor has a width between 20 mil and 24 mil; and
      said second end portion of said common conductor has a width between 20 mil and 24 mil.

3. A multi-band coupled-line coupler for RF power amplifier module application comprising:
   a first conductor having a first and a second end portion and a first parallel portion therebetween,
   a second conductor having a first and a second end portion and a second parallel portion therebetween, said second parallel portion positioned substantially parallel to said first parallel portion;
   a common conductor having a first and a second end portion and a third parallel portion therebetween, said third parallel portion positioned substantially parallel to and between said first and second parallel portion, said third parallel portion having a first distance from said first parallel portion and a second distance from said second parallel portion, said first distance being different from said second distance;
   a first capacitor connected between a first point on said first parallel portion and a third point on said third parallel portion; and
   a second capacitor connected between a second point on said second parallel portion and a fourth point on said third parallel portion, and a substrate layer, said first, second, and third conductors being formed on said substrate layer,
   wherein said substrate layer has a thickness between 8 mil and 10 mil and a dielectric constant between 3.8 and 4.

4. A communication device having a multi-band coupled-line coupler, said coupler comprising:

a first conductor having a first and a second end portion and a first parallel portion therebetween;

a second conductor having a first and a second end portion and a second parallel portion therebetween, said second parallel portion positioned substantially parallel to said first parallel portion;

a common conductor having a first and a second end portion and a third parallel portion therebetween, said third parallel portion positioned substantially parallel to and between said first and second parallel portion, said third parallel portion having a first distance from said first parallel portion and a second distance from said second parallel portion, said first distance being different from said second distance;

a first capacitor connected between a central one-third of said first parallel portion and a central one-third of said third parallel portion;

a second capacitor connected between a central one-third of said second parallel portion and the center one-third of said third parallel portion;

a power detector connected to said first end portion of said common conductor;

a termination connected to said second end portion of said common conductor;

a first band amplifier connected to said first end portion of said first conductor;

a first band harmonic filter connected to said second end portion of said first conductor;

a second band amplifier connected to said first end portion of said second conductor; and a second band harmonic filter connected to said second end portion of said second conductor.

5. The communication device of claim 4, wherein said first band is global system for mobile communications (GSM), and said second band is digital cellular system (DCS) or personal communications services (PCS).

6. The communication device of claim 4, further comprising a switch having at least a first position and a second position, said first position connecting said first and common conductors to thereby transmit and receive signals in said first band and, said second position connecting said second and common conductors to thereby transmit and receive signals in said second band.

7. The communication device of claim 6, wherein said switch has a third position in which signals may not be received or transmitted in either the first band or the second band.

* * * * *